United States Patent
Blackshear et al.

(10) Patent No.: US 9,818,682 B2
(45) Date of Patent: Nov. 14, 2017

(54) LAMINATE SUBSTRATES HAVING RADIAL CUT METALLIC PLANES

(71) Applicant: International Business Machines Corporation, Armonk, NY (US)

(72) Inventors: Edmund Blackshear, Wappingers Falls, NY (US); Shidong Li, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 258 days.

(21) Appl. No.: 14/558,864

(22) Filed: Dec. 3, 2014

(65) Prior Publication Data

US 2016/0163611 A1    Jun. 9, 2016

(51) Int. Cl.
*B32B 3/24* (2006.01)
*B32B 5/16* (2006.01)
(Continued)

(52) U.S. Cl.
CPC ........ *H01L 23/49833* (2013.01); *B32B 3/266* (2013.01); *B32B 7/02* (2013.01); *B32B 37/02* (2013.01); *B32B 37/182* (2013.01); *B32B 38/0004* (2013.01); *H01L 23/49838* (2013.01); *H01L 23/49894* (2013.01); *B32B 3/08* (2013.01); *B32B 3/10* (2013.01); *B32B 5/16* (2013.01); *B32B 15/092* (2013.01); *B32B 15/20* (2013.01); *B32B 27/04* (2013.01); *B32B 27/20* (2013.01); *B32B 27/38* (2013.01); *B32B 2250/05* (2013.01); *B32B 2250/40* (2013.01); *B32B 2260/046* (2013.01);
(Continued)

(58) Field of Classification Search
None
See application file for complete search history.

(56) References Cited

U.S. PATENT DOCUMENTS 3,969,177 A * 7/1976 Doran .................... B29C 35/02
156/288
4,048,438 A * 9/1977 Zimmerman ....... H01L 21/4839
174/254
(Continued)

FOREIGN PATENT DOCUMENTS

DE          2444698 A  *  4/1976
JP       60211897 A  *  10/1985
(Continued)

OTHER PUBLICATIONS

Machine Translation of JP 2009076721 A, Apr. 2009.*
(Continued)

*Primary Examiner* — Jeff Vonch
(74) *Attorney, Agent, or Firm* — Law Offices of Ira D. Blecker, P.C.

(57) ABSTRACT

A laminate substrate for receiving a semiconductor chip. Included are laminate layers stacked to form the laminate substrate, each laminate layer includes a core that includes particle-filled epoxy and a metallic layer on the core. At least one laminate layer has a radial cut through the metallic layer, the radial cut extending from a periphery of the at least one laminate layer towards a center of the at least one laminate layer. The radial cut cuts only through the metallic layer and does not cut through the core.

19 Claims, 9 Drawing Sheets

(51) Int. Cl.

| | | |
|---|---|---|
| *B32B 7/02* | (2006.01) | |
| *B32B 15/092* | (2006.01) | |
| *B32B 27/04* | (2006.01) | |
| *B32B 27/38* | (2006.01) | |
| *B32B 37/02* | (2006.01) | |
| *H01L 23/48* | (2006.01) | |
| *H01L 23/498* | (2006.01) | |
| *B32B 3/26* | (2006.01) | |
| *B32B 38/00* | (2006.01) | |
| *B32B 37/18* | (2006.01) | |
| *H05K 1/02* | (2006.01) | |
| *H05K 1/03* | (2006.01) | |
| *H05K 3/00* | (2006.01) | |
| *H05K 13/00* | (2006.01) | |
| *H01L 21/48* | (2006.01) | |
| *B32B 15/20* | (2006.01) | |
| *B32B 27/20* | (2006.01) | |
| *B32B 3/08* | (2006.01) | |
| *B32B 3/10* | (2006.01) | |

(52) U.S. Cl.
CPC ..... *B32B 2262/101* (2013.01); *B32B 2264/10* (2013.01); *B32B 2264/101* (2013.01); *B32B 2307/202* (2013.01); *B32B 2307/204* (2013.01); *B32B 2307/734* (2013.01); *B32B 2363/00* (2013.01); *B32B 2457/00* (2013.01); *B32B 2457/14* (2013.01); *H01L 21/4803* (2013.01); *H01L 23/49822* (2013.01); *H01L 23/49827* (2013.01); *H01L 2924/0002* (2013.01); *H01L 2924/3511* (2013.01); *H05K 1/0271* (2013.01); *H05K 2201/0137* (2013.01); *H05K 2201/0191* (2013.01); *H05K 2201/0206* (2013.01); *H05K 2201/0209* (2013.01); *H05K 2201/0929* (2013.01); *H05K 2201/09136* (2013.01); *H05K 2201/09209* (2013.01); *H05K 2203/06* (2013.01); *H05K 2203/061* (2013.01); *Y10T 29/4913* (2015.01); *Y10T 29/49126* (2015.01); *Y10T 428/24298* (2015.01); *Y10T 428/24314* (2015.01); *Y10T 428/24322* (2015.01); *Y10T 428/24331* (2015.01); *Y10T 428/25* (2015.01)

(56) References Cited

U.S. PATENT DOCUMENTS

| | | | | |
|---|---|---|---|---|
| 4,888,247 A * | 12/1989 | Zweben | ............ | B32B 15/08 257/E23.107 |
| 5,065,285 A * | 11/1991 | Nagai | ............ | H05K 3/4626 361/784 |
| 5,126,192 A * | 6/1992 | Chellis | ............ | C08J 5/24 361/748 |
| 5,220,723 A * | 6/1993 | Okada | ............ | H05K 3/0094 216/20 |
| 5,346,750 A * | 9/1994 | Hatakeyama | ......... | H05K 3/462 361/749 |
| 5,350,621 A * | 9/1994 | Yuhas | ............ | B32B 5/28 361/750 |
| 5,652,185 A | 7/1997 | Lee | | |
| 5,742,479 A | 4/1998 | Asakura | | |
| 5,793,098 A * | 8/1998 | Uchida | ............ | H01L 23/49827 257/665 |
| 5,874,776 A * | 2/1999 | Kresge | ............ | H01L 23/3733 257/731 |
| 6,160,526 A | 12/2000 | Hirai et al. | | |
| 6,163,462 A | 12/2000 | Buck | | |
| 6,236,572 B1 * | 5/2001 | Teshome | ............ | H05K 1/0219 174/261 |
| 6,326,557 B1 * | 12/2001 | Cheng | ............ | H05K 1/0216 174/255 |
| 6,329,603 B1 * | 12/2001 | Japp | ............ | H05K 3/4641 174/255 |
| 6,329,610 B1 * | 12/2001 | Takubo | ............ | H01L 23/49827 174/255 |
| 6,356,451 B1 * | 3/2002 | Nakagawa | ......... | H05K 1/0271 174/250 |
| 6,380,633 B1 * | 4/2002 | Tsai | ............ | H01L 21/4853 257/668 |
| 6,437,991 B1 * | 8/2002 | Rog | ............ | H05K 1/0218 174/260 |
| 6,486,537 B1 | 11/2002 | Liebhard | | |
| 6,518,514 B2 * | 2/2003 | Suzuki | ............ | H05K 3/4069 174/255 |
| 6,548,858 B2 * | 4/2003 | Cheng | ............ | H05K 1/024 174/255 |
| 6,586,687 B2 * | 7/2003 | Lee | ............ | H01R 12/526 174/261 |
| 6,638,607 B1 * | 10/2003 | Curcio | ............ | B32B 3/266 174/255 |
| 6,864,434 B2 * | 3/2005 | Chang | ............ | H01L 23/49822 174/255 |
| 7,180,162 B2 | 2/2007 | Paul et al. | | |
| 7,790,268 B2 * | 9/2010 | Kennedy | ......... | H05K 3/4626 174/258 |
| 8,024,857 B2 | 9/2011 | Jung et al. | | |
| 8,351,217 B2 | 1/2013 | Watanabe | | |
| 2003/0002260 A1 * | 1/2003 | Hasebe | ............ | H01L 23/142 361/720 |
| 2004/0150969 A1 * | 8/2004 | Chan | ............ | H01L 23/5383 361/792 |
| 2005/0016764 A1 * | 1/2005 | Echigo | ............ | H05K 3/4069 174/256 |
| 2005/0039950 A1 * | 2/2005 | Chan | ............ | H01L 25/0652 174/262 |
| 2005/0093133 A1 * | 5/2005 | Kawasaki | ......... | H01L 23/49822 257/700 |
| 2005/0103520 A1 * | 5/2005 | Saiki | ............ | H05K 3/0035 174/250 |
| 2005/0224767 A1 * | 10/2005 | Japp | ............ | H05K 1/0373 252/570 |
| 2005/0225955 A1 * | 10/2005 | Grebenkemper | .... | H05K 1/0218 361/780 |
| 2006/0029726 A1 * | 2/2006 | Mok | ............ | H05K 3/462 427/96.1 |
| 2006/0037193 A1 * | 2/2006 | Enomoto | ............ | H05K 3/4617 29/830 |
| 2006/0076668 A1 * | 4/2006 | Kim | ............ | H05K 1/0216 257/691 |
| 2006/0243478 A1 * | 11/2006 | Inagaki | ............ | H01L 21/4857 174/255 |
| 2007/0004097 A1 * | 1/2007 | Yu | ............ | H01L 23/49811 438/129 |
| 2007/0232727 A1 * | 10/2007 | Lin | ............ | B82Y 30/00 523/440 |
| 2008/0073784 A1 * | 3/2008 | Lee | ............ | H01L 23/3121 257/738 |
| 2008/0083560 A1 * | 4/2008 | Saiki | ............ | H01L 23/49827 174/255 |
| 2008/0105455 A1 | 5/2008 | Palfreyman et al. | | |
| 2008/0216298 A1 * | 9/2008 | Dudnikov | ......... | H01G 4/06 29/25.42 |
| 2008/0283288 A1 * | 11/2008 | Mok | ............ | H05K 3/462 174/264 |
| 2009/0032285 A1 * | 2/2009 | Ueda | ............ | H05K 1/024 174/250 |
| 2009/0107714 A1 * | 4/2009 | Ogasawara | ......... | H05K 1/0271 174/260 |
| 2009/0155552 A1 * | 6/2009 | Blackshear | ......... | B32B 17/04 428/209 |
| 2010/0006328 A1 * | 1/2010 | Kawasaki | ......... | H01L 23/49811 174/258 |
| 2010/0164030 A1 * | 7/2010 | Oggioni | ............ | H01L 23/145 257/432 |

(56) References Cited

U.S. PATENT DOCUMENTS

| | | | | |
|---|---|---|---|---|
| 2010/0208442 A1* | 8/2010 | Asano | ............... | H01L 21/563 361/783 |
| 2010/0218364 A1* | 9/2010 | Sri-Jayantha | ..... | H01L 23/49833 29/593 |
| 2010/0230145 A1* | 9/2010 | Holcomb | ............ | H05K 3/4614 174/257 |
| 2010/0264423 A1* | 10/2010 | Wood | ............... | H01L 21/268 257/75 |
| 2011/0067901 A1* | 3/2011 | Kim | ............... | H01L 23/49838 174/250 |
| 2011/0073358 A1* | 3/2011 | Hayashi | ............ | H05K 3/4602 174/258 |
| 2011/0214906 A1* | 9/2011 | Baars | ............... | B05D 5/12 174/257 |
| 2011/0284273 A1* | 11/2011 | Japp | ............... | H05K 3/4641 174/257 |
| 2012/0235141 A1* | 9/2012 | Masubuchi | ......... | H05K 1/0271 257/48 |
| 2012/0241197 A1* | 9/2012 | Hiraoka | ............ | H05K 1/0271 174/250 |
| 2013/0105063 A1* | 5/2013 | Dauksher | ............ | B32B 37/182 156/64 |
| 2013/0242520 A1* | 9/2013 | Onozuka | ............ | B32B 5/02 361/783 |
| 2013/0320578 A1* | 12/2013 | Blackshear | ......... | H01L 21/4803 264/40.1 |
| 2013/0334711 A1* | 12/2013 | Blackshear | ............ | H01L 23/145 257/778 |
| 2014/0374914 A1* | 12/2014 | Kim | ............... | H01L 23/562 257/773 |
| 2016/0157357 A1* | 6/2016 | Lamorey | ............... | H01L 23/562 29/850 |

FOREIGN PATENT DOCUMENTS

| | | | | | |
|---|---|---|---|---|---|
| JP | 02060185 | A | * | 2/1990 | |
| JP | 04097595 | A | * | 3/1992 | |
| JP | 07111387 | A | * | 4/1995 | |
| JP | 09283867 | A | * | 10/1997 | |
| JP | 11135949 | A | * | 5/1999 | |
| JP | 2000114676 | A | * | 4/2000 | |
| JP | 2001007481 | A | * | 1/2001 | |
| JP | 2002111145 | A | * | 4/2002 | |
| JP | 2005317587 | A | * | 11/2005 | |
| JP | 2008112862 | A | * | 5/2008 | |
| JP | 2009076565 | A | * | 4/2009 | |
| JP | 2009076721 | A | * | 4/2009 | |
| JP | 2010238692 | A | * | 10/2010 | |
| JP | WO 2015083216 | A1 | * | 6/2015 | ........... H05K 1/0271 |
| WO | WO 2010065973 | A1 | * | 6/2010 | ............. H05K 1/162 |

OTHER PUBLICATIONS

Machine Translation of JP 2010238692 A, Oct. 2010.*
English Abstract for JP 02060185 A, Feb. 1990.*
Machine Translation for JP 2000114676 A, Apr. 2000.*
Machine Translation of JP 2001007481 A, Jan. 2001.*

* cited by examiner

LAMINATE SUBSTRATES HAVING RADIAL CUT METALLIC PLANES

BACKGROUND

The present invention relates to organic laminate substrates and, more particularly, relates to organic laminate substrates which have been modified to alleviate certain stresses which may cause out-of-plane warpage during thermal excursions.

Organic laminate substrates, due to the nature of functional electrical designs, are fabricated with materials properties gradients from center to periphery and from top to bottom in the chipsite area. These materials properties gradients, primarily in coefficient of thermal expansion and Young's modulus, drive radial stresses during heating and cooling. Reactive hoop stresses oppose these radial stresses. Both these radial stresses and reactive hoop stresses are relieved by out of plane warpage during thermal excursions. Out of plane warpage can cause problems, such as shorts and opens in semiconductor chip joining, as well as similar difficulties in module and assembly fabrication. Industry solutions may be design restrictions, which can limit function of the organic laminate substrate, and fixturing during manufacturing, which may be expensive.

BRIEF SUMMARY

The various advantages and purposes of the exemplary embodiments as described above and hereafter are achieved by providing, according to a first aspect of the exemplary embodiments, a laminate substrate for receiving a semiconductor chip including: a plurality of laminate layers stacked to form the laminate substrate, each laminate layer comprising a core comprising particle-filled epoxy and a metallic layer on the core; wherein at least one laminate layer having a radial cut through the metallic layer, the radial cut extending from a periphery of the laminate layer towards a center of the at least one laminate layer, the radial cut cutting only through the metallic layer and not cutting through the core.

According to a second aspect of the exemplary embodiments, there is provided a laminate substrate for receiving a semiconductor chip including: a plurality of laminate layers, each laminate layer comprising a core comprising particle-filled epoxy and a metallic layer on the core; a central core layer comprising a central core comprising particle-filled epoxy and a first metallic layer on a first side of the central core and a second metallic layer on a second side of the central core, the central core being thicker than the core of the plurality of laminate layers; and wherein some of the plurality of laminate layers are top laminate layers, are positioned above the central core layer and the topmost of the top laminate layers is configured to receive a semiconductor chip and some of the plurality of laminate layers are bottom laminate layers and are positioned below the central core layer, such that the top laminate layers, central core layer and bottom laminate layers are stacked to form the laminate substrate; wherein at least one laminate layer of the top laminate layers and bottom laminate layers having a radial cut through the metallic layer of the at least one laminate layer, the radial cut extending from a periphery of the at least one laminate layer towards a center of the at least one laminate layer, the radial cut cutting only through the metallic layer of the at least one laminate layer and not cutting through the core of the at least one laminate layer.

According to a third aspect of the exemplary embodiments, there is provided a method of forming a laminate substrate for receiving a semiconductor chip including: forming a central core layer comprising a central core comprising particle-filled epoxy and a first metallic layer on a first side of the central core and a second metallic layer on a second side of the central core, the central core being thicker than the core of the plurality of laminate layers; forming a top laminate layer around a top of the central core layer and forming a bottom laminate layer around a bottom of the central core layer, each laminate layer comprising a core comprising particle-filled epoxy and a metallic layer on the core; forming additional laminate layers on previous laminate layers to form additional bottom laminate layers and top laminate layers until a required number of top laminate layers and bottom laminate layers have been formed on the central core layer; wherein at least one laminate layer of the top and bottom laminate layers being formed with a radial cut through the metallic layer of the at least one laminate layer, the radial cut extending from a periphery of the at least one laminate layer towards a center of the at least one laminate layer, the radial cut cutting only through the metallic layer of the at least one laminate layer and not cutting through the core of the at least one laminate layer.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

DETAILED DESCRIPTION

In an organic laminate substrate, copper wiring planes are the element with the highest Young's modulus, which is 5 to 20 times that of other substrate elements at room temperature. At solder reflow temperature, due to the softening of organic laminate components, this ratio increases to a factor of several hundred. Due to the high stiffness of copper wiring planes, copper wiring planes have a dominant effect in generating and reacting to stresses from thermal expansion. Another element of the composite with high stiffness is the core reenforcing glass epoxy, if used.

Since copper density is low in the top center of the substrate and higher in the periphery and bottom, and since non-copper elements such as epoxy dielectric and glass fibers have mechanical properties differing significantly from those of copper, heating and cooling generates radial stresses, either tensile or compressive depending on the materials used, radiating from the die center. If the peripheral copper planes are continuous, stiff peripheral copper resists expansion and contraction through circumferential hoop stresses absorbed by the stiff material. By radially cutting this peripheral copper, the organic laminate substrate is rendered unable to resist expansion and contraction and so hoop stresses may be relieved. Further, since the hoop stresses drive out-of-plane warpage, relieving hoop stresses may also reduce out-of-plane warpage.

Figure 1:
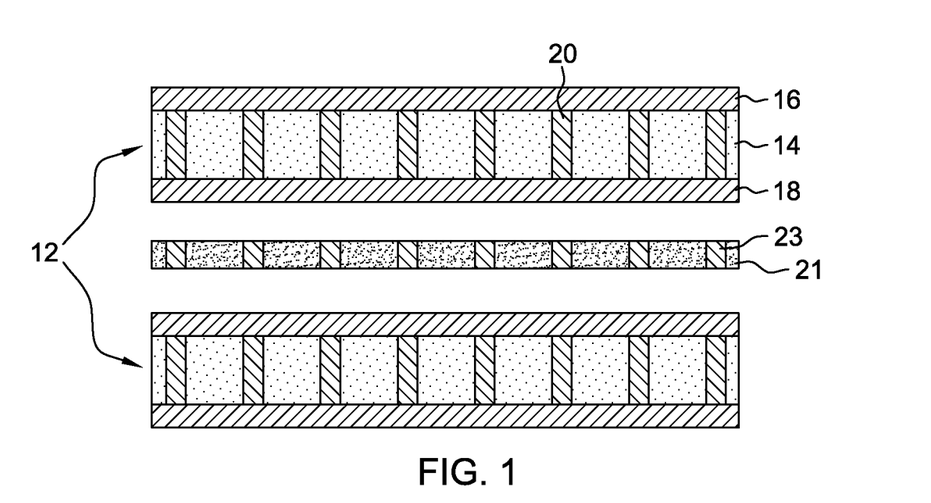
FIG. 1 is a crossectional view of two laminate layers of a first exemplary embodiment of an organic laminate substrate.

Referring to the drawings in more detail, and particularly referring to FIG. 1, there is shown in cross section two laminate layers 12 of a first embodiment of an organic laminate substrate. There will usually be more than two laminate layers 12 in an organic laminate substrate but only two laminate layers 12 are shown for the purpose of illustration. Each laminate layer 12 includes an organic core 14 of particle-filled epoxy wherein the particles are usually silica. The organic core 14 may have a top metallic plane 16 and a bottom metallic plane 18. Interconnecting the top metallic plane 16 and the bottom metallic plane 18 may be metallic vias 20. For purposes of illustration and not limitation, the metallic planes 16, 18 and metallic vias 20 are copper and may be circuitized to provide the necessary circuitry. Hereafter, the metallic planes 16, 18 and metallic vias 20 may be referred to as copper planes 16, 18 and copper vias 20. An insulating layer 21 may be formed between two adjacent laminate layers 12. The insulating layer 21 may be, for example, particle-filled epoxy. The insulating layer 21 may have metallic vias 23, preferably copper, to provide electrical connectivity between the adjacent laminate layers 21.

Figure 2:
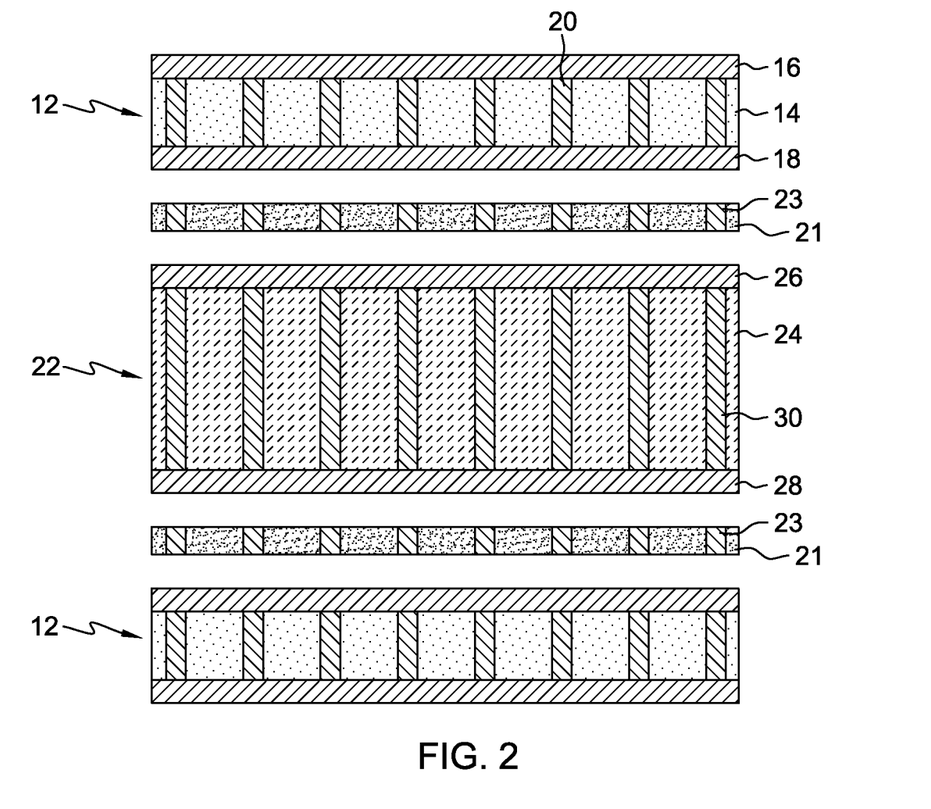
FIG. 2 is a crossectional view of two laminate layers and a core laminate layer of a second exemplary embodiment of an organic laminate substrate.

Referring to FIG. 2, there is shown in cross section a second embodiment of an organic laminate substrate. Two laminate layers 12 and a core laminate layer 22 are shown. There will usually be more than two laminate layers 12 in an organic laminate substrate but only two laminate layers 12 are shown for the purpose of illustration. The laminate layers 12 shown in FIG. 2 may be the same laminate layers 12 shown in FIG. 1. The core laminate layer 22 includes an organic core 24 of particle-filled epoxy wherein the particles are usually glass. The organic core 24 may have a top metallic plane 26 and a bottom metallic plane 28 which may be circuitized to provide the necessary circuitry. Interconnecting the top metallic plane 26 and the bottom metallic plane 28 may be metallic vias 30. For purposes of illustration and not limitation, the metallic planes 26, 28 and metallic vias 30 are copper and may be circuitized to provide the necessary circuitry. Hereafter, the metallic planes 26, 28 and metallic vias 30 may be referred to as copper planes 26, 28 and copper vias 30. It is noted that core laminate layer 22 is substantially thicker than laminate layers 12. For the purposes of illustration and not limitation, organic core 14 may have a thickness of about 3 to 32 microns (μm) while the organic core 24 may have a thickness of about 200 to 1200 μm. The copper planes 16, 18, 26, 28 may have a thickness of about 5 to 25 μm. An insulating layer 21 having metallic vias 23 may be formed between the core laminate layer 22 and the laminate layers 12 as well as between two adjacent laminate layers 12. The insulating layer 21 may be, for example, particle-filled epoxy.

According to the invention, the present inventors have proposed that at least one of the laminate layers in the organic substrate laminate has a radial "cut" through one or both of the copper planes. By "cut", it is meant that the copper plane has a discontinuity so that the periphery of the copper plane is not stiff and hoop stresses may be relieved. The copper plane may not actually be "cut" by an instrumentality such as a saw but during the patterning of the copper plane, the copper plane may be patterned so that no copper is present in certain areas of the copper plane which appear as if cut by a saw or some such instrument.

The radial cut extends from a periphery of the copper plane towards a center of the at least one laminate layer. The radial cut may further continue from a point near or at the center of the at least one laminate layer to an opposite side of the periphery of the copper plane. It should be understood that while the copper planes may extend to the periphery of the organic core of the laminate layer, as shown in FIGS. 1 and 2, this may not always be the case as in some instances the copper planes may be recessed slightly from the periphery of the organic core. The important point is to have the radial cut extend to the periphery of the copper plane. Again, the radial cut cuts only through one or both of the copper planes but does not cut through the organic core of the laminate layer. The organic core is so soft (compared to the copper planes) that it does not add much stiffness to the laminate layer so radial cuts through the organic core are not necessary.

Figure 3:
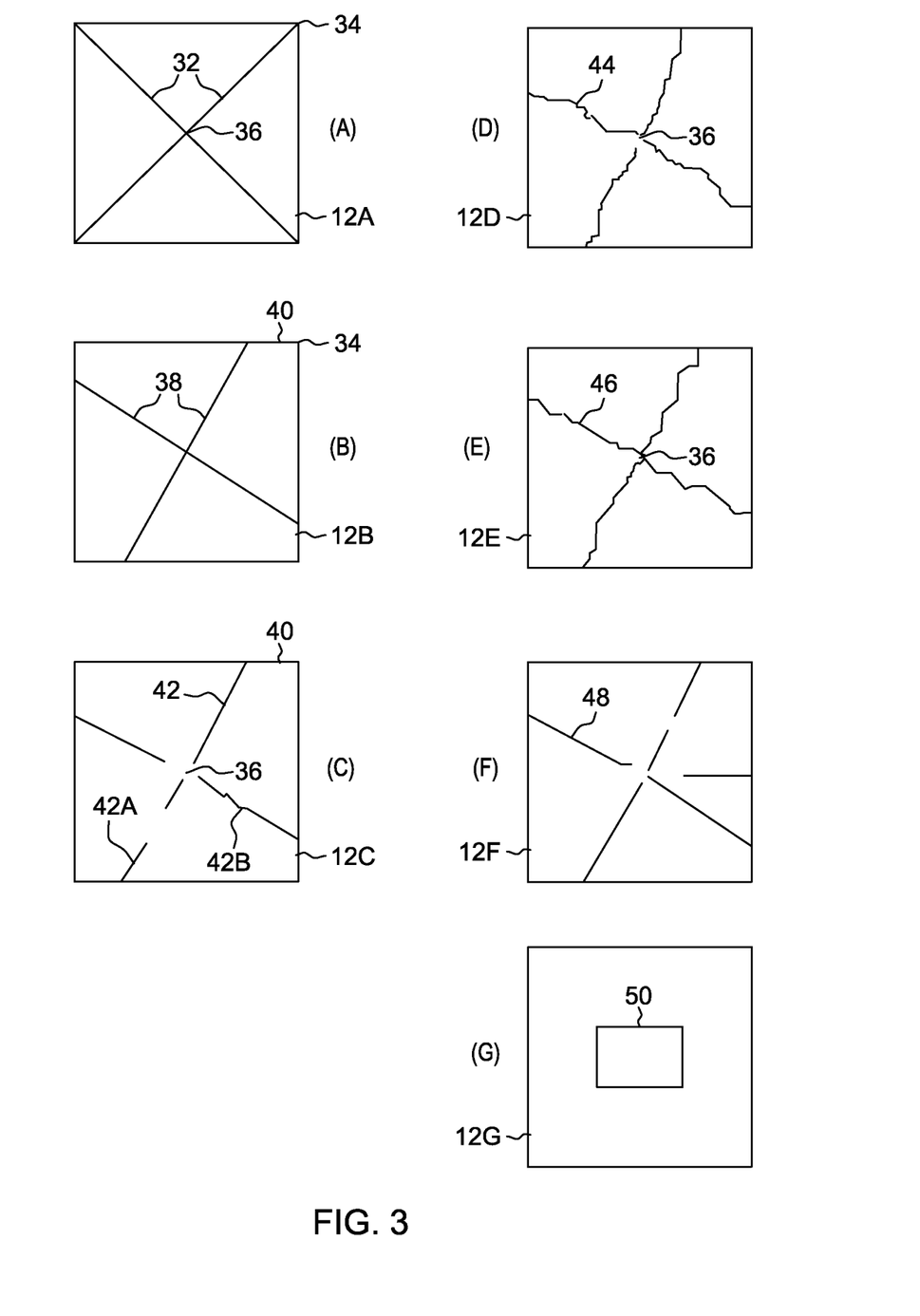
FIG. 3 illustrates the various laminate layers of an organic laminate substrate using the laminate layers of FIG. 1 with each of the laminate layers having a radial cut pattern.

Referring to FIG. 3, there is disclosed the various laminate layers of an organic laminate substrate using the laminate layers of FIG. 1 with each of the laminate layers having a radial cut pattern. In FIG. 3, there are shown seven laminate layers, FIG. 3A to 3G with FIG. 3A being the bottom layer and FIG. 3G being the top layer. Intervening insulating layers 21 are not shown. FIG. 3A illustrates a laminate layer 12A having radial cuts 32 which extend from the corners 34 of the laminate layer 12 through the center 36 of the laminate layer 12A to the opposite corners of the laminate layer 12A. Radial cuts 32, and all other radial cuts, should start at the outermost periphery of the copper planes to effectively reduce hoop stress. Further, while the radial cuts 32, and other radial cuts herein, show the radial cuts extending from the periphery of the laminate layer to the center and then continuing on to the opposite periphery, the radial cuts need not have a matching, opposite radial cut. That is, radial cut 32, for example, may continue to the center of the laminate layer 12A and end there without continuing to the opposite periphery.

Referring now to FIG. 3B, radial cuts 38 extend across the laminate layer 12B from the periphery 40 of the laminate layer 12B but do not extend to the corners 34 of the laminate layer 12B. As can be seen, the radial cuts 38 in laminate layer 12B are offset from the radial cuts 32 in laminate layer 12A. While offsetting of the radial cuts 32, 38 is not necessary to achieve the advantages of the exemplary embodiments, it is preferred so that the organic laminate substrate is not weakened by the radial cuts which are directly over each other.

In FIG. 3C, the radial cuts 42 extend from the periphery 40 of the laminate layer 12C but do not extend all the way to the center 36 of the laminate layer 12C. Further, the radial cuts 42 need not be continuous as shown by the gap in radial cut 42A nor do they need to be in a straight line as shown by radial cut 42B.

FIGS. 3D and 3E illustrate other patterns of radial cuts 44, 46 in laminate layers 12D and 12E which meander from the periphery 40 to the center 36 to avoid certain wiring patterns in these laminate layers.

FIG. 3F illustrates straight radial cuts which extend from the periphery 40 of the laminate layer 12F to the opposite side of the periphery 40.

Laminate layer 12G is the top layer of the organic laminate substrate and may or may not have any radial cuts. As presently shown, laminate layer 12G has no radial cuts. The laminate layer 12G may have a semiconductor device joining area 50 for joining a semiconductor device (not shown) such as a semiconductor chip.

It should be understood that while FIG. 3 illustrates all of laminate layers 12A to 12F having radial cuts, this is not necessary to achieve the advantages of the exemplary embodiments. Depending on the stresses that need to be relieved, some or all of the laminate layers 12A to 12F may have radial cuts.

Figure 4:
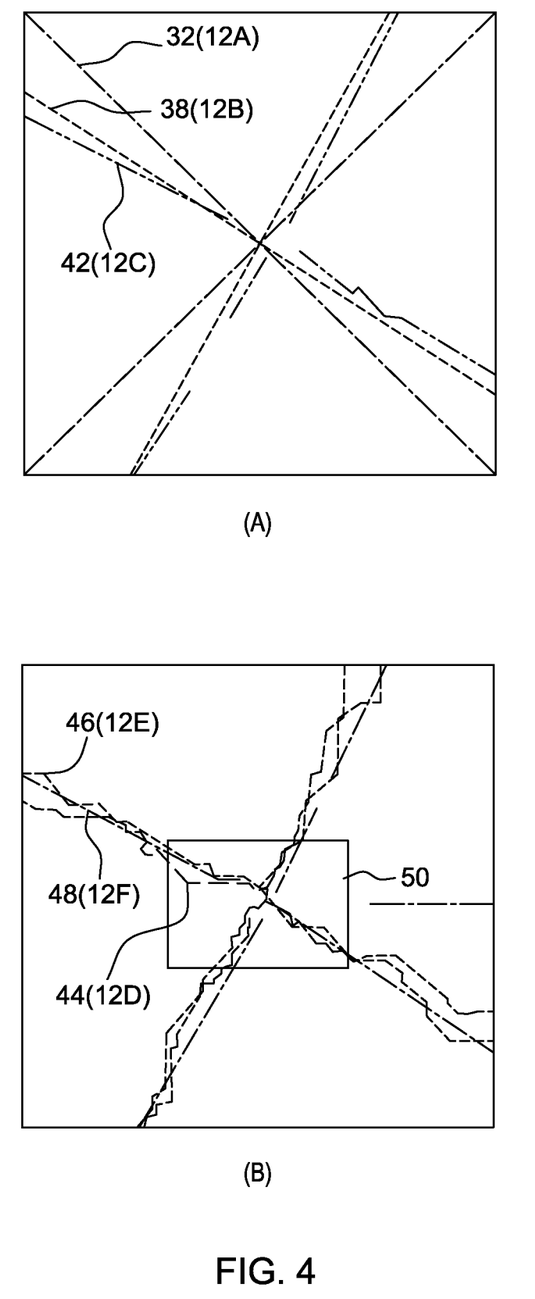
FIG. 4 illustrates the stacking of the laminate layers of FIG. 3.

Referring now to FIGS. 4A and 4B, the laminate layers 12A to 12G of FIG. 3 have been stacked to illustrate that in the preferred exemplary embodiment, the radial cuts of each laminate layer may be offset from the radial cuts in an adjacent laminate layer. In order to see the offsetting of the radial cuts in each of the laminate layers more clearly, laminate layers 12A to 12C have been stacked and illustrated in FIG. 4A while laminate layers 12D to 12G have been stacked and illustrated in FIG. 4B. Referring first to FIG. 4A, it can be seen that radial cuts 32 (laminate layer 12A), 38 (laminate layer 12B) and 42 (laminate layer 12C) are all offset from one another. Referring now to FIG. 4B, it can be seen that radial cuts 44 (laminate layer 12D), 46 (laminate layer 12E) and 48 (laminate layer 12F) are also all offset from one another. Top laminate layer 12G having semiconductor device joining area 50 is shown in the stack in FIG. 4B but it has no radial cuts.

Figure 5:
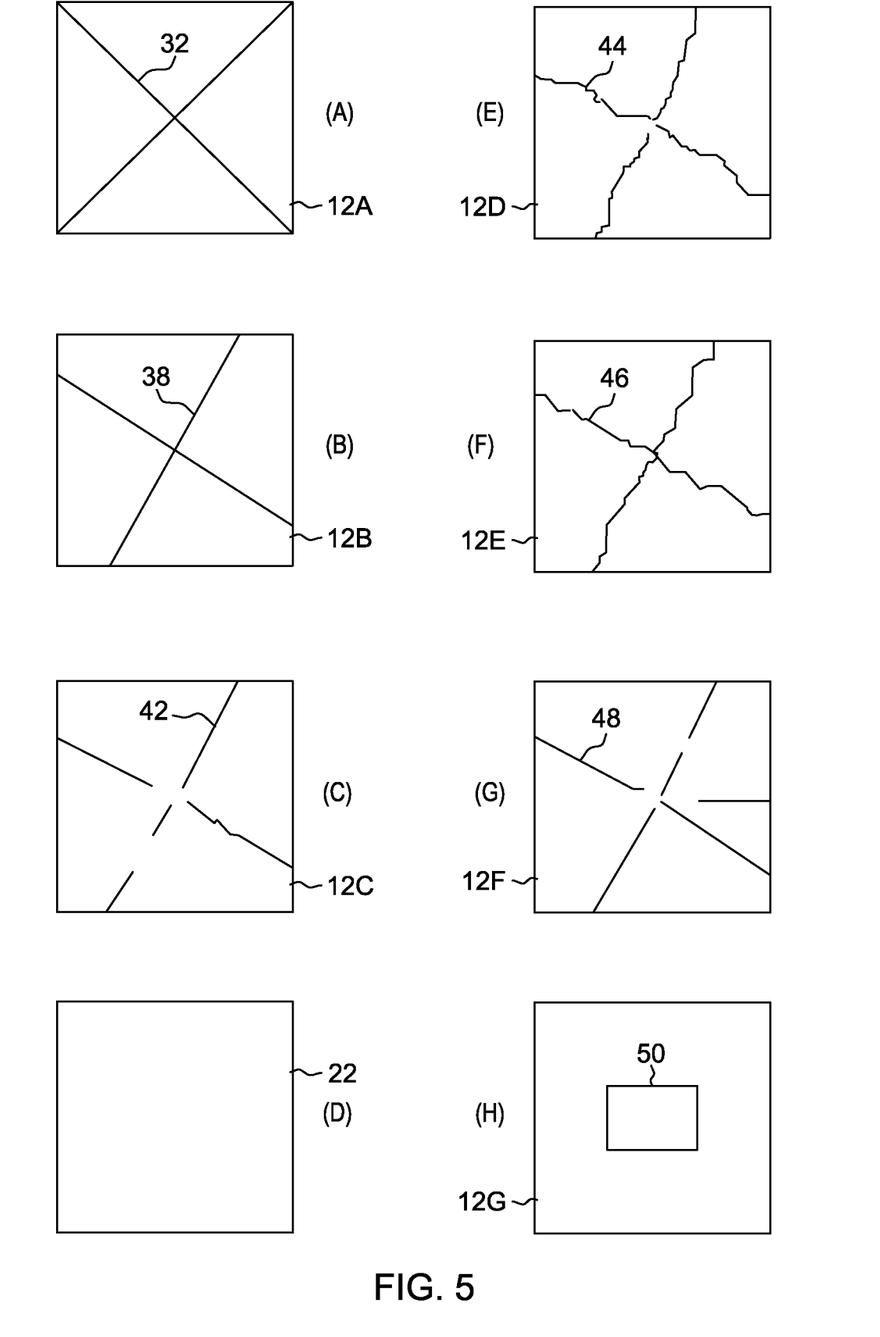
FIG. 5 illustrates the various laminate layers of an organic laminate substrate using the laminate layers of FIG. 2 with each of the laminate layers having a radial cut pattern.

Referring to FIG. 5, there is disclosed the various laminate layers of an organic laminate substrate using the laminate layers of FIG. 2 with each of the laminate layers having a radial cut pattern. In FIG. 5, there are shown seven laminate layers plus a core laminate layer. Intervening insulating layers 21 are not shown in FIG. 5. Laminate layers 12A to 12G are identical to laminate layers 12A to 12G in FIG. 3. In FIG. 5, however, a core laminate layer such as core laminate layer 22 shown in FIG. 2 has been added to the laminate layers that will be stacked to form the organic laminate substrate. Core laminate layer 22 has no radial cuts but it should be understood that in other embodiments, the core laminate layer 22 may have such radial cuts. That is, core laminate layer 22 may be composed of a single glass-fiber reinforced epoxy layer so there will be no radial cuts in core laminate layer 22. However, if core laminate layer 22 was a multilayer core including copper planes, then the copper planes within the core laminate layer 22 may have radial cuts.

Figure 6:
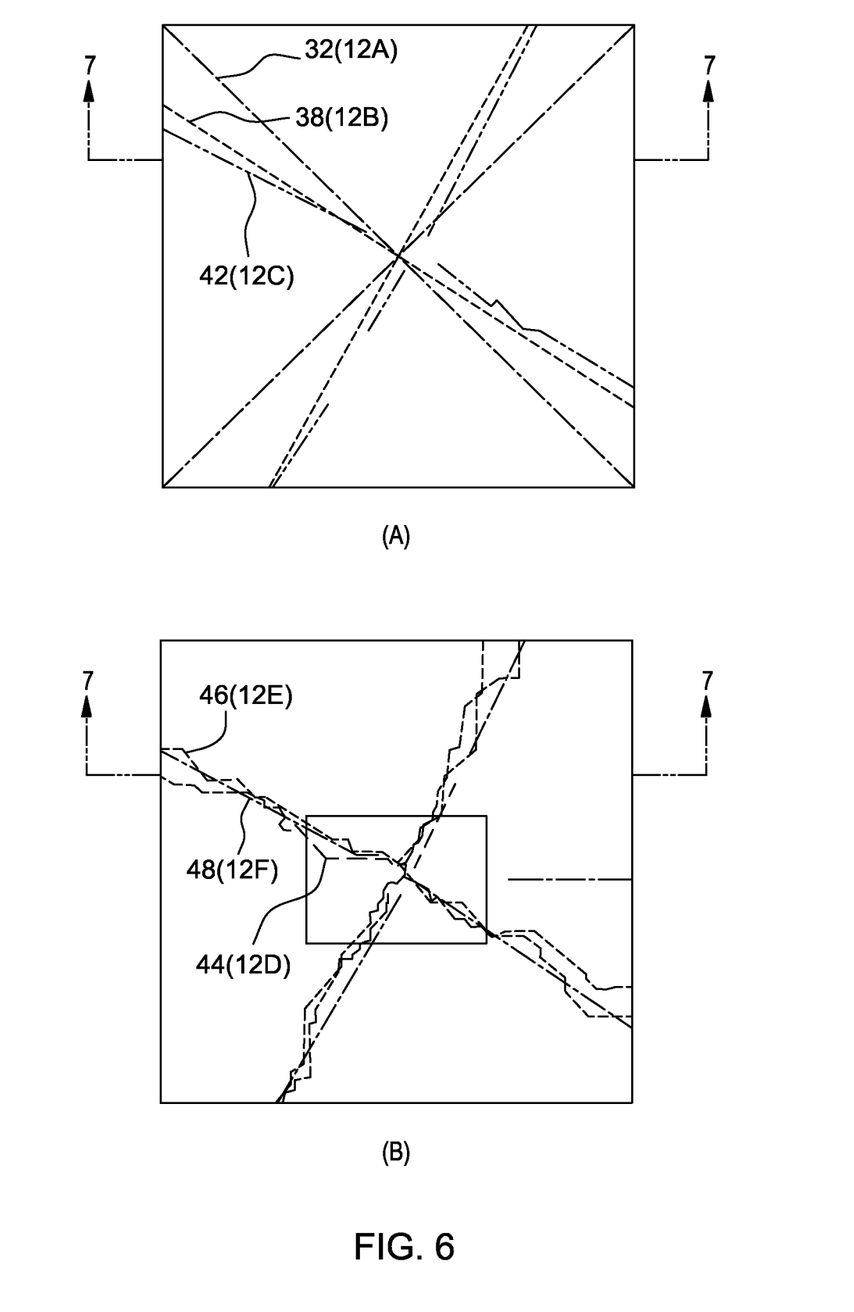
FIG. 6 illustrates the stacking of the laminate layers of FIG. 5.

Referring now to FIGS. 6A and 6B, the laminate layers 12A to 12G of FIG. 5 plus the core laminate layer 22 have been stacked to illustrate that in the preferred exemplary embodiment, the radial cuts of each laminate layer may be offset from the radial cuts in an adjacent laminate layer. In order to see the offsetting of the radial cuts in each of the laminate layers more clearly, laminate layers 12A to 12C plus core laminate layer 22 have been stacked and illustrated in FIG. 6A while laminate layers 12D to 12G have been stacked and illustrated in FIG. 6B. Moreover, each of FIGS. 6A and 6B have been sectioned in the direction of arrows 7-7 and those sections have been put together to form one figure, FIG. 7.

Figure 7:
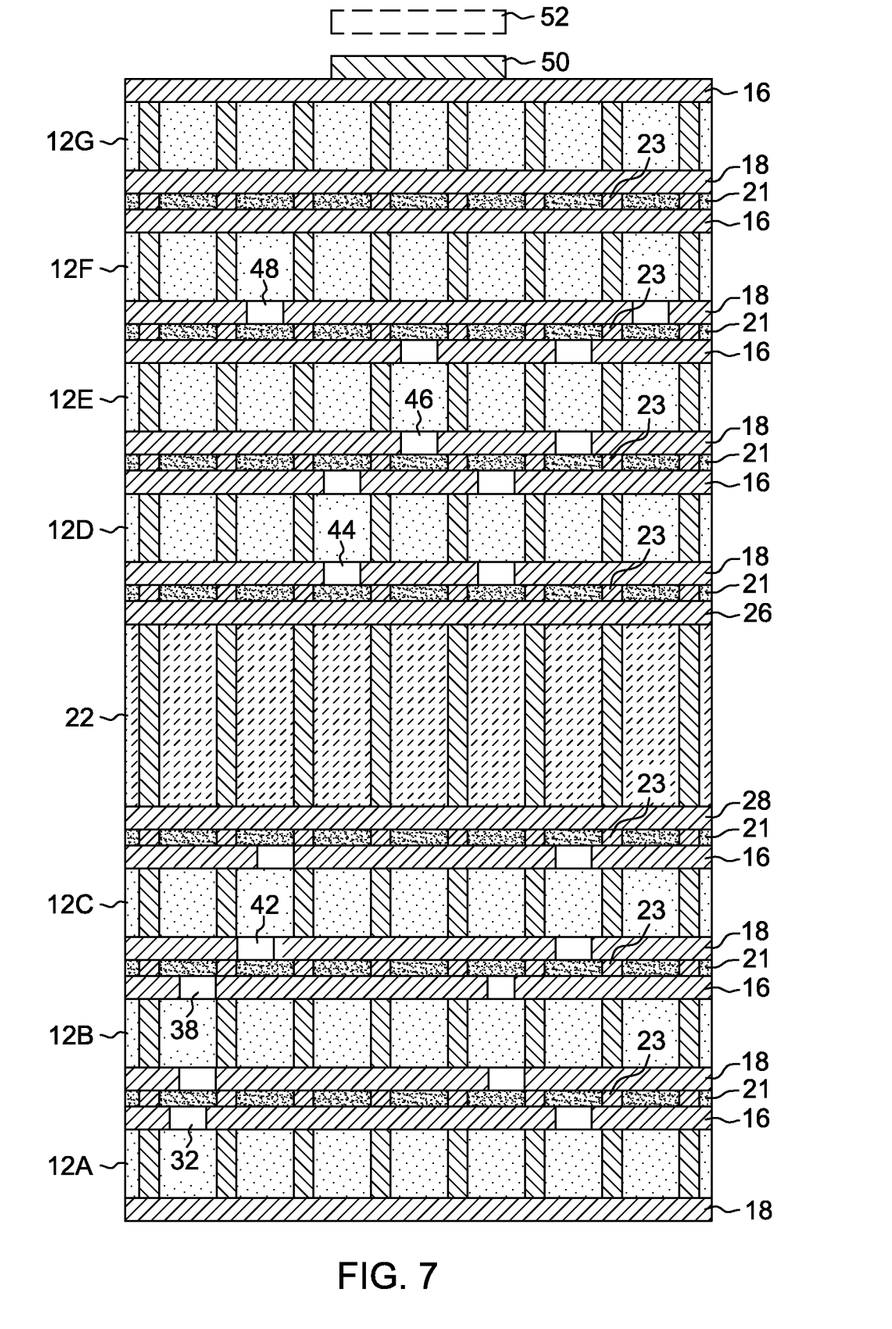
FIG. 7 illustrates in cross section the stacking of all of the laminate layers and the core laminate layer of FIG. 5.

Referring to FIG. 7, all off laminate layers 12A to 12G plus core laminate layer 22 and intervening insulating layers 21 have been stacked and shown in cross section. Laminate layers 12A and 12F have radial cuts 32 and 48, respectively, only in one wiring plane—copper plane 16 in laminate layer 12A and copper plane 18 in laminate layer 12F. Laminate layers 12B to 12E all have the radial cuts 38, 42, 44 and 46, respectively, in both copper planes 16, 18. Core laminate layer 22 and laminate layer 12G have no radial cuts. Again, it should be understood that while all of laminate layers 12A to 12F have radial cuts, it is not necessary that all of the laminate layers 12A to 12F have radial cuts as in some circumstances only some or perhaps only one of the laminate layers 12A to 12F may have radial cuts.

Moreover, it may be that some or all of the laminate layers 12A to 12C below the core laminate layer 22 may have radial cuts while some or all of the laminate layers 12D to 12F, as well as the top laminate layer 12G, above the core laminate layer 22 may have no radial cuts which may be especially useful to reduce an anticipated concave shape of the organic laminate substrate. Alternatively, it may be that some or all of the laminate layers 12A to 12C below the core laminate layer 22 may have no radial cuts while some or all of the laminate layers 12D to 12F, as well as the top laminate layer 12G, above the core laminate layer 22 may have radial cuts which may be especially useful to reduce an anticipated convex shape of the organic laminate substrate.

FIG. 7 also illustrates a semiconductor device 52 that may be joined to semiconductor device joining area 50.

In general, the number of laminate layers having radial cuts may be increased to increase the effectiveness of the exemplary embodiments. Spacing the radial cuts closely together in adjacent layers may also increase the effectiveness of the exemplary embodiments.

Figure 8:
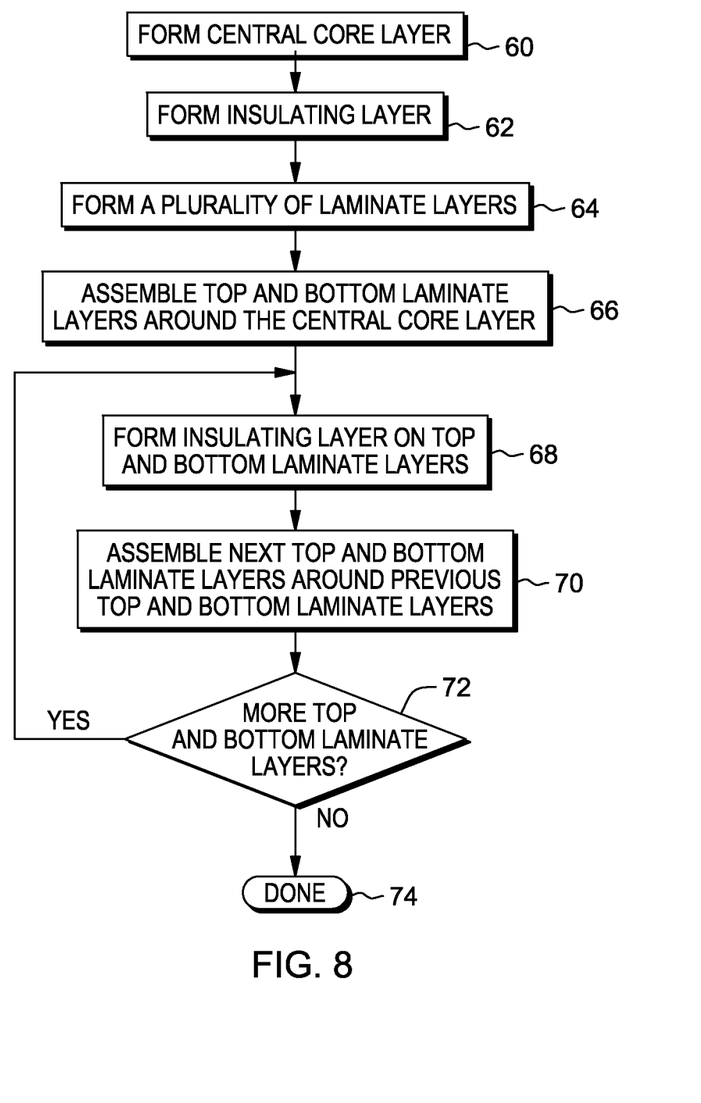
FIG. 8 is a flow chart illustrating an exemplary embodiment of a method of forming the organic laminate of FIG. 7.

Referring now to FIG. 8, there is disclosed another exemplary embodiment pertaining to a method of forming a laminate substrate for receiving a semiconductor chip. A central core layer may be formed which includes a central core including particle-filled epoxy and a first metallic layer on a first side of the central core and a second metallic layer on a second side of the central core, box 60. The central core is thicker than the core of the plurality of laminate layers. An insulating layer is formed on the top and bottom of the central core, box 62. Then, plurality of laminate layers are formed with each laminate layer including a core including particle-filled epoxy and a first metallic layer on a first side of the core and a second metallic layer on a second side of the core, box 64. A laminate layer is assembled around the insulating layer on the bottom of the central core layer to form a bottom laminate layer and a laminate layer is assembled around the insulating layer on the top of the central core layer to form a top laminate layer, box 66. An insulating layer is formed on each of the top and bottom laminate layers, box 68. Additional top and bottom laminate layers may be assembled around the previous top and bottom laminate layers that were formed around the central core layer, box 70. At least one laminate layer of the top and bottom laminate layers in steps 64, 66 is formed with a radial cut through at least one of the first metallic layer and the second metallic layer, the radial cut extending from a periphery of the at least one laminate layer towards a center of the at least one laminate layer and continuing from a point near or at the center of the at least one laminate layer to an opposite side of the periphery. As previously shown, for example, in FIG. 7, the radial cut cuts only through the at least one of the first metallic layer and the second metallic layer and not cutting through the core of the at least one laminate layer. The at least one laminate layer having the radial cut may be a top laminate layer or a bottom laminate layer. Additional top and bottom laminate layers and intervening insulating layers may be added until the required number of laminate layers have been added, box 72. If more laminate layers are needed, the process returns to step 69 to add more insulating and laminate layers. If the right number of top and bottom laminate layers have been added, then the process ends, box 74. The laminate substrate may then be passed on for further processing.

Figure 9:
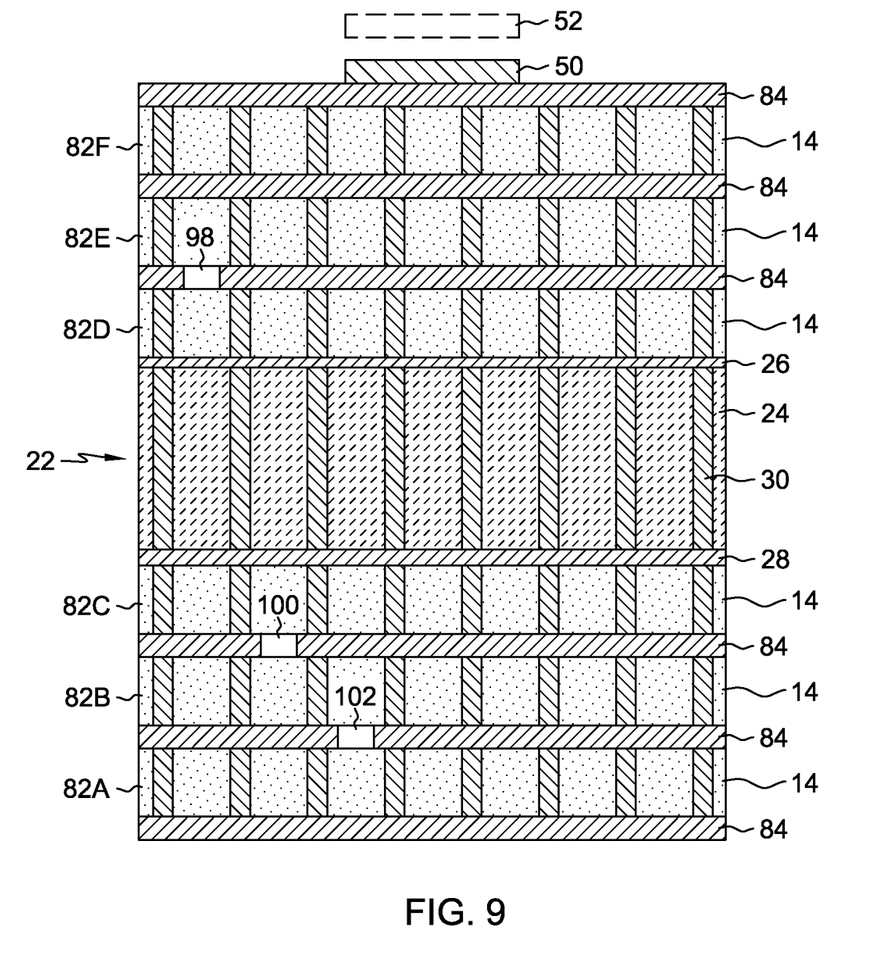
FIG. 9 illustrates in cross section the stacking of all of the laminate layers and the core laminate of a third exemplary embodiment of an organic laminate substrate.

FIG. 9 illustrates a third exemplary embodiment of an organic laminate substrate. The organic laminate substrate of FIG. 9 includes the core laminate layer 22 described previously. To this core laminate layer 22 have been added a plurality of laminate layers 82A to 82F with laminate layers 82A to 82C being bottom laminate layers and laminate layers 82D to 82F being top laminate layers. Each of the laminate layers 82A to 82F includes an organic core 14 of particle-filled epoxy and a circuitized metallic layer 84. Conventional vias have been formed in each of the laminate layers 82A to 82F. Bottom laminate layers 82B and 82C each contain radial cuts 102 and 100, respectively. Top laminate layer 82D may also have a radial cut 98. It should be understood that the radial cuts 98, 100, 102 are only for the purpose of illustration and not limitation. Also shown in FIG. 9 is a semiconductor device 52 that may be joined to semiconductor device joining area 50.

Figure 10:
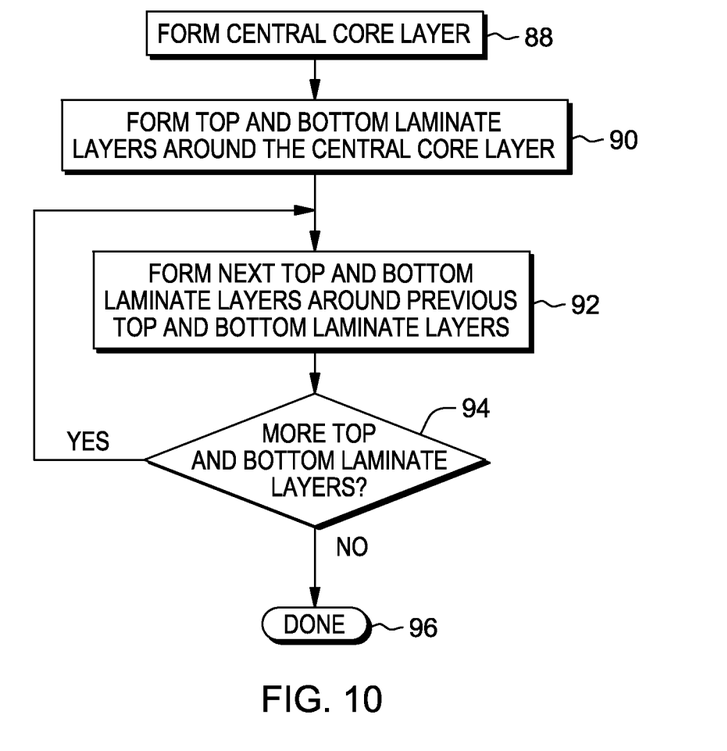
FIG. 10 is a flow chart illustrating an exemplary embodiment of a method of forming the organic laminate of FIG. 8.

Referring now to FIG. 10, there is disclosed an exemplary method of forming the organic laminate substrate of FIG. 9. A central core layer including a central core comprising particle-filled epoxy and a first metallic layer on a first side of the central core and a second metallic layer on a second side of the central core is formed, box 88. The central core is thicker than the core of a plurality of laminate layers that will subsequently be added to the central core layer. A top laminate layer is formed around a top of the central core layer and a bottom laminate layer is formed around a bottom of the central core layer, box 90. Each laminate layer includes a core comprising particle-filled epoxy and a metallic layer on the core. Additional laminate layers are formed on previous laminate layers to form additional bottom laminate layers and top laminate layers until a required number of top laminate layers and bottom laminate layers have been formed on the central core layer, boxes 92, 94. At least one laminate layer of the top and bottom laminate layers is formed with a radial cut through the metallic layer of the at least one laminate layer, the radial cut extending from a periphery of the at least one laminate layer towards a center of the at least one laminate layer, the radial cut cutting only through the metallic layer of the at least one laminate layer and not cutting through the core of the at least one laminate layer. All of the metallic layers in the central core layer, top laminate layer and bottom laminate layers are circuitized by known methods to form the necessary circuitry and radial cut. The laminate substrate may then be passed on for further processing.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A laminate substrate for receiving a semiconductor chip comprising:
a plurality of laminate layers stacked to form the laminate substrate, each laminate layer comprising a core comprising particle-filled epoxy, a top metallic layer on top of the core and a bottom metallic layer underneath the core;
a plurality of insulating layers devoid of metallic layers such that one insulating layer is placed between each pair of laminate layers and is in direct contact with the top metallic layer and the bottom metallic layer wherein each insulating layer has a thickness that is less than a thickness of the core of the plurality of laminate layers;
wherein at least one laminate layer having a radial cut through at least one of the top metallic layer and the bottom metallic layer, the radial cut extending from a periphery of the at least one laminate layer towards a center of the at least one laminate layer, the radial cut cutting only through the at least one of the top metallic layer and the bottom metallic layer and not cutting through the core; and
further comprising a central core layer comprising a central core comprising particle-filled epoxy and a first metallic layer on a first side of the central core and a second metallic layer on a second side of the central core, the central core being thicker than the core of each of the plurality of laminate layers wherein there are a plurality of laminate layers above the central core layer and a plurality of laminate layers below the central core layer, wherein there is placed one insulating layer devoid of metallic layers between the central core layer and one laminate layer above the central core layer and there is placed one insulating layer devoid of metallic layers between the central core layer and one laminate layer below the central core and wherein a top layer above the central core layer is for receiving the semiconductor chip.

2. The laminate substrate of claim 1 wherein the at least one laminate layer having at least two radial cuts.

3. The laminate substrate of claim 1 wherein the at least one laminate layer radial cut from the periphery towards the center of the at least one laminate layer is not continuous.

4. The laminate substrate of claim 1 wherein the at least one laminate layer radial cut from the periphery towards the center of the at least one laminate layer is continuous.

5. The laminate substrate of claim 1 wherein the at least one laminate layer radial cut from the periphery towards the center of the at least one laminate layer is not in a straight line.

6. The laminate substrate of claim 1 wherein a second laminate layer having a radial cut through at least one of the top metallic layer and the bottom metallic layer of the second laminate layer, the radial cut extending from a periphery of the second laminate layer towards a center of the second one laminate layer, the radial cut cutting only through the at least one of the top metallic layer and the bottom metallic layer of the second laminate layer and not cutting through the core of the second laminate layer such that the radial cut is devoid of the metallic material and the insulating material.

7. The laminate substrate of claim 6 wherein the radial cut of the first laminate layer is offset from the radial cut of the second laminate layer so that the radial cut of the first laminate layer is not directly in line with the radial cut of the second laminate layer wherein the radial cut of the first laminate layer and the radial cut of the second laminate layer are devoid of the metallic material and the insulating material.

8. A laminate substrate for receiving a semiconductor chip comprising:
 a plurality of laminate layers, each laminate layer comprising a core comprising particle-filled epoxy, a top metallic layer on top of the core and a bottom metallic layer underneath the core;
 a plurality of insulating layers devoid of metallic layers such that one insulating layer is placed between each pair of laminate layers and is in direct contact with the top metallic layer and the bottom metallic layer wherein each insulating layer has a thickness that is less than a thickness of the core of the plurality of laminate layers;
 a central core layer comprising a central core comprising particle-filled epoxy and a first metallic layer on a first side of the central core and a second metallic layer on a second side of the central core, the central core being thicker than the core of the plurality of laminate layers wherein there is placed one insulating layer devoid of metallic layers between the central core layer and one laminate layer above the central core layer and there is placed one insulating layer devoid of metallic layers between the central core layer and one laminate layer below the central core and; and
 wherein some of the plurality of laminate layers are top laminate layers, are positioned above the central core layer and the topmost of the top laminate layers is configured to receive a semiconductor chip and some of the plurality of laminate layers are bottom laminate layers and are positioned below the central core layer, such that the top laminate layers, central core layer and bottom laminate layers are stacked to form the laminate substrate;
 wherein at least one laminate layer of the top laminate layers and bottom laminate layers having a radial cut through at least one of the top metallic layer and the bottom metallic layer of the at least one laminate layer, the radial cut extending from a periphery of the at least one laminate layer towards a center of the at least one laminate layer, the radial cut cutting only through the at least one of the top metallic layer and the bottom metallic layer of the at least one laminate layer and not cutting through the core of the at least one laminate layer.

9. The laminate substrate of claim 8 wherein the at least one laminate layer having at least two radial cuts.

10. The laminate substrate of claim 8 wherein the at least one laminate layer radial cut from the periphery towards the center of the at least one laminate layer is not continuous.

11. The laminate substrate of claim 8 wherein the at least one laminate layer radial cut from the periphery towards the center of the at least one laminate layer is continuous.

12. The laminate substrate of claim 8 wherein the at least one laminate layer radial cut from the periphery towards the center of the at least one laminate layer is not in a straight line.

13. The laminate substrate of claim 8 wherein a second laminate layer of the top laminate layers and bottom laminate layers having a radial cut through the at least one of the top metallic layer and the bottom metallic layer of the second laminate layer, the radial cut of the second laminate layer extending from a periphery of the second laminate layer towards a center of the second laminate layer , the radial cut of the second laminate layer cutting only through the at least one of the top metallic layer and the bottom metallic layer of the second laminate layer and not cutting through the core of the second laminate layer such that the radial cut of the second laminate layer is devoid of the metallic material and the insulating material.

14. The laminate substrate of claim 13 wherein the radial cut of the first laminate layer is offset from the radial cut of the second laminate layer so that the radial cut of the first laminate layer is not directly in line with the radial cut of the second laminate layer wherein the radial cut of the first laminate layer and the radial cut of the second laminate layer are devoid of the metallic material and the insulating material.

15. The laminate substrate of claim 13 wherein the first laminate layer and the second laminate layer are selected from the bottom laminate layers.

16. The laminate substrate of claim 13 wherein the first laminate layer and the second laminate layer are selected from the top laminate layers.

17. The laminate substrate of claim 13 wherein the first laminate layer is selected from the top laminate layers and the second laminate layer is selected from the bottom laminate layers.

18. A method of forming a laminate substrate for receiving a semiconductor chip comprising:
 forming a central core layer comprising a central core comprising particle-filled epoxy and a first metallic layer on a top side of the central core and a second metallic layer on a bottom side of the central core;
 placing a top insulating layer devoid of metallic layers directly on the top side of the central core layer;
 placing a bottom insulating layer devoid of metallic layers directly underneath the bottom side of the central core layer;
 forming a top laminate layer directly on the top insulating layer and forming a bottom laminate layer directly on the bottom insulating layer , each laminate layer comprising a core comprising particle-filled epoxy, a top metallic layer on top of the core and a bottom metallic layer underneath the core;
 forming additional insulating and laminate layers on previous laminate layers to form additional bottom insulating layers and bottom laminate layers and top insulating layers and top laminate layers until a required number of top insulating layer layers and top laminate layers and bottom insulating layers and bottom laminate layers have been formed;
 wherein the central core being thicker than the core of each of the top and bottom laminate layers;
 wherein each insulating layer has a thickness that is less than a thickness of the core of the laminate layers; and
 wherein at least one laminate layer of the top and bottom laminate layers being formed with a radial cut through at least one of the top metallic layer and the bottom metallic layer of the at least one laminate layer, the radial cut extending from a periphery of the at least one laminate layer towards a center of the at least one laminate layer, the radial cut cutting only through the at least one of the top metallic layer and the bottom metallic layer of the at least one laminate layer and not cutting through the core of the at least one laminate layer.

19. The method of claim 18 wherein a second laminate layer having a radial cut through the metallic layer of the second laminate layer, the radial cut extending from a periphery of the second laminate layer towards a center of the second laminate layer, the radial cut cutting only through the at least one of the top metallic layer of the second laminate layer and the bottom metallic layer and not cutting through the core of the second laminate layer such that the radial cut is devoid of the metallic material and the insulating material wherein the radial cut of the first laminate layer is offset from the radial cut of the second laminate layer so that the radial cut of the first laminate layer is not directly in line with the radial cut of the second laminate layer and wherein the radial cut of the first laminate layer and the radial cut of the second laminate layer are devoid of the metallic material and the insulating material.

\* \* \* \* \*